(12) United States Patent
Sung et al.

(10) Patent No.: US 9,373,729 B2
(45) Date of Patent: Jun. 21, 2016

(54) SOLAR CELL AND METHOD OF MANUFACTURING THE SAME

(75) Inventors: Myoung Seok Sung, Seoul (KR); Se Han Kwon, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 359 days.

(21) Appl. No.: 13/981,450

(22) PCT Filed: Nov. 18, 2011

(86) PCT No.: PCT/KR2011/008856
§ 371 (c)(1), (2), (4) Date: Jul. 24, 2013

(87) PCT Pub. No.: WO2012/102468
PCT Pub. Date: Aug. 2, 2012

(65) Prior Publication Data
US 2013/0306146 A1    Nov. 21, 2013

(30) Foreign Application Priority Data
Jan. 24, 2011 (KR) .......................... 10-2011-0006981

(51) Int. Cl.
*H01L 31/0224* (2006.01)
*H01L 31/02* (2006.01)
*H01L 31/046* (2014.01)

(52) U.S. Cl.
CPC .... *H01L 31/02021* (2013.01); *H01L 31/02008* (2013.01); *H01L 31/046* (2014.12); *Y02E 10/50* (2013.01)

(58) Field of Classification Search
CPC .............. H01L 31/02; H01L 31/02008; H01L 31/02021; H01L 31/046
USPC ........................................................ 136/249
See application file for complete search history.

(56) References Cited

U.S. PATENT DOCUMENTS

| | | | | | |
|---|---|---|---|---|---|
| 4,356,341 | A | * | 10/1982 | Borden | H01L 27/142 136/249 |
| 4,485,264 | A | * | 11/1984 | Izu | H01L 31/02167 136/244 |
| 6,133,521 | A | * | 10/2000 | Haga | H01L 31/02008 136/251 |
| 2010/0024864 | A1 | | 2/2010 | Kim et al. | |
| 2011/0017279 | A1 | * | 1/2011 | Baumbach | H01L 31/02008 136/251 |
| 2011/0232744 | A1 | * | 9/2011 | Larsen | H01L 31/0236 136/256 |

FOREIGN PATENT DOCUMENTS

| | | |
|---|---|---|
| JP | 2004-319615 A | 11/2004 |
| JP | 2010-109207 A | 5/2010 |
| KR | 10-2010-0109310 A | 10/2010 |
| WO | WO-2009/112503 A1 | 9/2009 |

OTHER PUBLICATIONS

International Search Report in International Application No. PCT/KR2011/008856, filed Nov. 18, 2011.
Notice of Allowance dated Sep. 7, 2012 in Korean Application No. 10-2011-0006981, filed Jan. 24, 2011.
Office Action dated Dec. 16, 2014 in Chinese Application No. 201180037819X, filed Jan. 24, 2011.

* cited by examiner

*Primary Examiner* — Jayne Mershon
(74) *Attorney, Agent, or Firm* — Saliwanchik, Lloyd & Eisenschenk

(57) ABSTRACT

Provided is a solar cell. The solar cell includes: a substrate including through lines opposing to each other; a semiconductor layer on a top side of the substrate; bus lines at both edges of a top side of the semiconductor layer; and bus bars connected electrically to the bus lines, respectively, and extending to a rear side of the substrate through the through lines.

13 Claims, 3 Drawing Sheets

SOLAR CELL AND METHOD OF MANUFACTURING THE SAME

CROSS-REFERENCE TO RELATED APPLICATIONS

This application is the U.S. national stage application of International Patent Application No. PCT/KR2011/008856, filed Nov. 18, 2011, which claims priority to Korean Application No. 10-2011-0006981, filed Jan. 24, 2011, the disclosures of each of which are incorporated herein by reference in their entirety.

TECHNICAL FIELD

The present disclosure relates to a solar cell and a method of manufacturing the same.

BACKGROUND ART

A solar cell converts solar energy into electric energy. Such a solar cell is extensively commercialized as energy needs are increased recently.

In general, a thin film solar cell is divided into a plurality of solar unit cells as its area becomes greater and the plurality of divided solar unit cells are connected in series to output power collected therefrom to the outside.

For this, a bus bar is connected to the both ends of the plurality of solar unit cells. The bus bar is connected to a junction box at the rear of a substrate through a through hole in the substrate to output the collected power. However, since the through hole in the substrate is always formed in the same area, the position of the junction box at the rear of the substrate is fixed.

Additionally, in relation to a typical thin film solar cell, an isolation process is additionally performed on the edge area of a thin film after other processes are performed in order to prevent electrical short. This makes manufacturing process more complex and operational performance less efficient.

DISCLOSURE OF INVENTION

Technical Problem

Embodiments provide a solar cell providing structural stability by obtaining the degree of freedom in positioning a junk box and a method of manufacturing the same.

Embodiments also provide a method of manufacturing a solar cell that does not require an edge isolation process. Embodiments also provide a method of manufacturing a solar cell in which a substrate is easily fixed and adhered during manufacturing processes.

Solution to Problem

In one embodiment, a solar cell includes:
a substrate including through lines opposing to each other;
a semiconductor layer on a top side of the substrate;
bus lines at both edges of a top side of the semiconductor layer; and
bus bars connected electrically to the bus lines, respectively, and extending to a rear side of the substrate through the through lines.

In another embodiment, a method of manufacturing a solar cell includes:
forming through lines to face each other on a substrate;
forming a semiconductor layer on a top side of the substrate;
forming bus lines at both edges of a top side of the semiconductor layer;
adhering one end of a bus bar to the bus line; and
positioning the other end of the bus bar at a rear side of the substrate through the through line.

Advantageous Effects of Invention

In a solar cell according to an embodiment, a through line is formed in a substrate and a bus bar is connected to the rear of the substrate through the through line, thereby increasing the degree of freedom in positioning a junk box at the rear of the substrate. Additionally, in a solar cell according to an embodiment, a semiconductor layer having a stepped multi-layered structure is formed on a substrate to omit an edge isolation process.

Additionally, a method of manufacturing a solar cell according to an embodiment uses a substrate fixing device combined with a through line of a substrate to make the fixation and adhesion of the substrate easy during manufacturing processes.

BEST MODE FOR CARRYING OUT THE INVENTION

In the descriptions of embodiments, it will be understood that when a substrate, a frame, a sheet, a layer or a pattern is referred to as being 'on' or 'under' another substrate, a frame, a sheet, a layer or a pattern, it can be directly on or under another layer or substrate, or intervening layers may also be present. Further, the reference about 'on' and 'under' each component will be made on the basis of drawings. In addition, the sizes of elements and the relative sizes between elements may be exaggerated for further understanding of the present disclosure.

Figure 1:
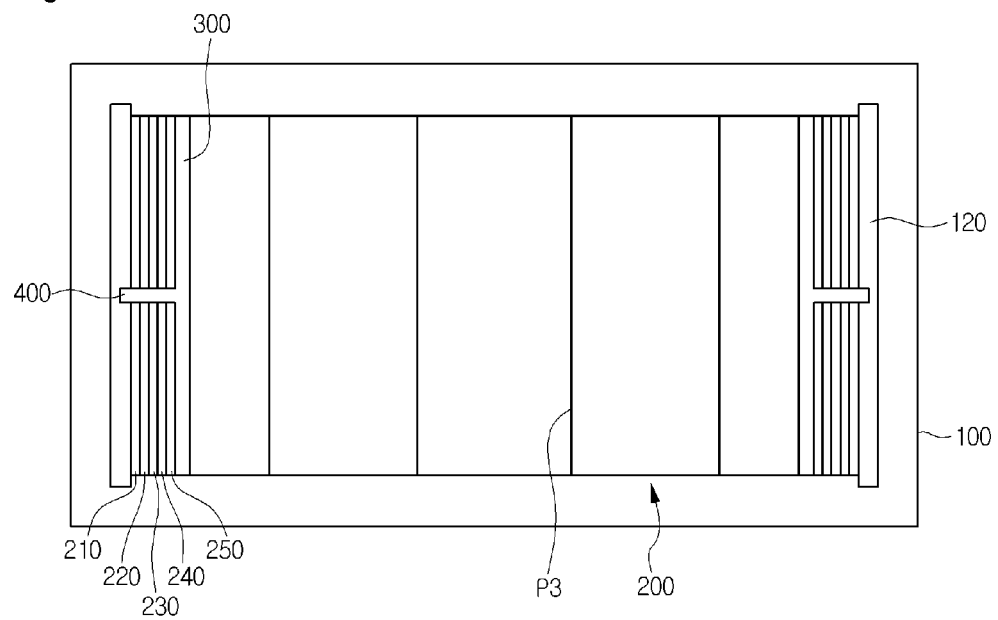
FIG. 1 is a plan view of a solar cell according to an embodiment.
Figure 2:
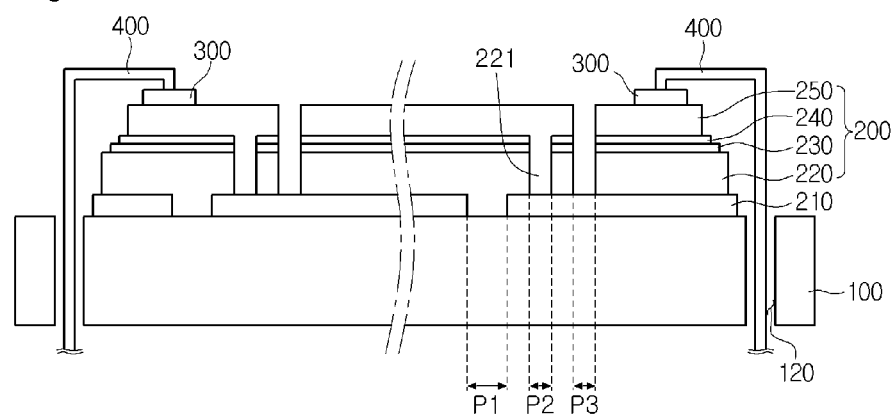
FIG. 2 is a sectional view of a solar cell according to an embodiment.
Figure 3:
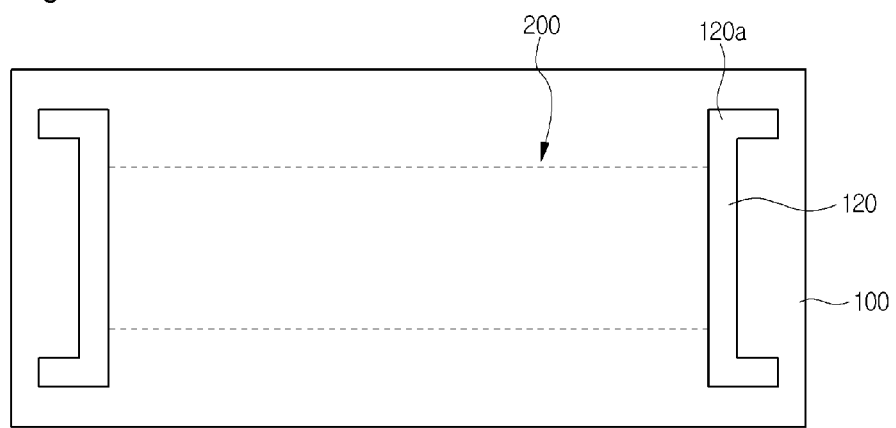
FIGS. 3 to 5 are plan views illustrating a modification example of a substrate having a through line according to an embodiment.
Figure 4:
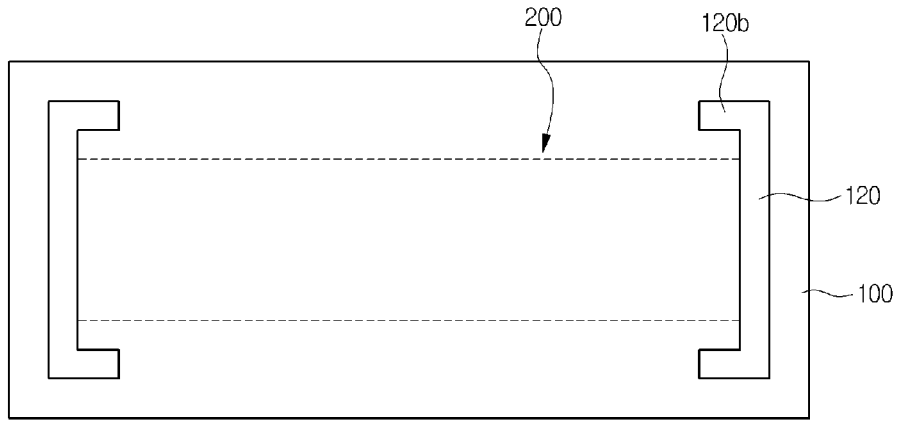
Figure 5:
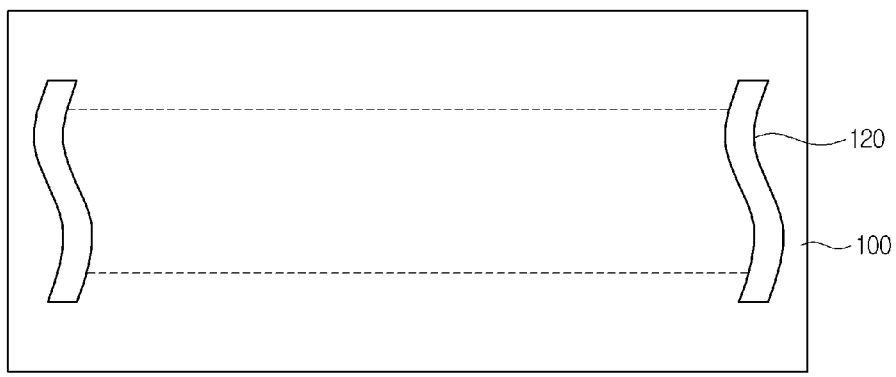

FIG. 1 is a plan view of a solar cell according to an embodiment and FIG. 2 is a sectional view of a solar cell according to an embodiment. Additionally, FIGS. 3 to 5 are plan views illustrating a modification example of a substrate having a through line according to an embodiment.

Referring to FIGS. 1 and 2, a solar cell according to an embodiment includes a substrate 100 having opposing through lines 120, a semiconductor layer 200 on the substrate 100, bus lines 300 at the both edges of the semiconductor layer 200, and bus bars 400 connected electrically to the bus lines 300 and extending to the rear of the substrate 100 through the through lines 120.

The substrate 100 has a plate shape and supports the semiconductor layer 200, the bus line 300, and the bus bar 400. The substrate 100 may be transparent and rigid or flexible. The substrate 100 may be an electrical insulator. For example, the substrate 100 may be a glass substrate, a plastic substrate, or a metal substrate.

In more detail, the substrate may be a soda lime glass containing sodium. Unlike this, the substrate 100 may be formed of ceramic such as alumina, stainless steel, and plastic such as Polyethylene Terephthalate (PET), Polyethylenenaphthelate (PEN), Polypropylene (PP), and Tri Acethl Cellulose (TAC).

The through lines 120 vertically passing through the substrate 100 is formed in the substrate 100. The through lines 120 are formed in the substrate 100 to face each other. In more detail, the through lines 120 may be formed to be disposed at the both edges of the substrate 100 and to face each other. Additionally, the through lines 120 are formed in areas that do not interfere with the semiconductor layer 200 described later.

The through lines 120 may have a straight line or curved shape, but are not limited thereto. In more detail, the through lines 120 may be formed with a bar shape extending in one direction. Additionally, the length and width of the through line 120 may vary.

The semiconductor layer 200 is formed on the top side of the substrate 100. The semiconductor layer 200 may be a Copper Indium Gallium Selenide (CIGS) based semiconductor layer having excellent photovoltaic efficiency and durability, but is not limited thereto.

The semiconductor layer 200 may be formed between the through lines 120 in the substrate 100. Additionally, the semiconductor layer 200 with a plurality of divided unit cells may be formed through a patterning process P3. Referring to FIG. 1, the semi-conductor layer 200 is divided into five unit cells, but is not limited thereto.

Referring to FIG. 2, the semiconductor layer 200 includes a rear electrode layer 210, a CIGS based light absorbing layer 220, a first buffer layer 230, a high resistance buffer layer 240, and a transparent electrode layer 250, which are sequentially formed on the substrate 100.

The rear electrode layer 210 may be a conductive layer. The rear electrode layer 210 may be formed of one of molybdenum (Mo), gold (Au), aluminum (Al), chrome (Cr), tungsten (W), and copper (Cu), but is not limited thereto. Among them, since especially Mo has a less difference in thermal expansion coefficient with respect to the substrate 100 as compared to other elements, adhesiveness is excellent and due to this, a delamination phenomenon may be prevented. Moreover, Mo may satisfy the characteristics required for the rear electrode layer 210 overall. Moreover, the rear electrode layer 210 may include two or more layers. The layers may be formed of the same metal or respectively different metals.

The rear electrode layer 210 is divided into a plurality of rear electrode layers by a first through grooves P1. The first through grooves P1 may have not only a stripe shape as illustrated in FIG. 1 but also a matrix shape, but is not limited thereto. The first through groove P1 may have a width ranging from about 80 μm to about 200 μm, but is not limited thereto.

The light absorbing layer 220 may be disposed on the rear electrode layer 210. The light absorbing layer 220 include a Group I-III-VI compound. For example, the light absorbing layer 220 may have a copper-indium-gallium-selenide based (Cu(In, Ga)(Se, S)2; CIGSS based) crystal structure, or a copper-indium-selenide or copper-gallium-selenide based crystal structure.

The buffer layer 230 is disposed on the light absorbing layer 220. The buffer layer 230 may serve to alleviate an energy gap between the light absorbing layer 220 and the transparent electrode layer 250 described later. The buffer layer 230 includes cadmium sulfide, ZnS, InXSY, and InXSeYZn(O, OH). The buffer layer 230 may have a thickness ranging from about 50 nm to about 150 nm, and an energy band gap ranging from about 2.2 eV to about 2.4 eV.

The high resistance buffer layer 240 is formed on the buffer layer 230. The high resistance buffer layer 240 is formed to have high resistance so that it is insulated from the transparent electrode layer 250 and prevents electrical damage. The high resistance buffer layer 240 may be formed of a zinc oxide (i-ZnO) undoped with an impurity. The high resistance buffer layer 240 may have an energy band gap ranging from about 3.1 eV to about 3.3 eV. The high resistance buffer layer 240 may be omitted.

The light absorbing layer 220, the buffer layer 230, and the high resistance buffer layer 240 include a second through groove P2. That is, the second through recess P2 may pass through the light absorbing layer 220, the buffer layer 230, and the high resistance buffer layer 240. The rear electrode layer 210 is partially exposed through the second through groove P2. The second through groove P2 may have a width ranging from about 80 μm to about 200 μm, but is not limited thereto.

The second through groove P2 may be filled with the same material as the transparent electrode layer 250, thereby forming a connecting line 221. The connecting line 221 may electrically connect the transparent electrode layer 250 and the rear electrode layer 210.

The transparent electrode layer 250 may be formed of a light-transmitting and conductive material. Additionally, the transparent electrode layer 250 may have characteristics of an n type semiconductor. In this case, the transparent electrode layer 250 forms an n type semiconductor layer together with the buffer layer 230 in order to form a pn junction with the light absorbing layer 220 (that is, a p type semiconductor layer). For example, the transparent electrode layer 250 may be formed of aluminum-doped zinc oxide (AZO). The transparent electrode layer 250 may have a thickness ranging from about 100 nm to about 500 nm.

The transparent electrode layer 250, the high resistance buffer layer 240, the buffer layer 230, and the light absorbing layer 220 include a third through groove P3. The rear electrode layer 210 is partially exposed through the third through grooves P3, and from this, the semiconductor layer 200 may be formed with a plurality of divided cells. Additionally, the plurality of cells may be electrically connected to each other through the connecting lines 221. The third through grooves P3 may have a width ranging from about 80 μm to about 200 μm, but are not limited thereto.

Moreover, the semiconductor layer 200 includes a stepped multi-layered structure. That is, the rear electrode layer 210 to the transparent electrode layer 250, used for forming the semiconductor layer 200, may constitute a stepped multi-layered structure. In more detail, the rear electrode layer 210, the light absorbing layer 220, the buffer layer 230, the high resistance buffer layer 240, and the transparent electrode layer 250 may be sequentially stacked on the substrate 100 to have edges with stepped portions.

For example, each width of the rear electrode layer 210, the light absorbing layer 220, the buffer layer 230, the high resistance buffer layer 240, and the transparent electrode layer 250 may be progressively and sequentially narrower from the substrate 100. Accordingly, a solar cell according to an embodiment may be formed without an edge isolation process, which is used for removing the edge of the semiconductor layer 200 after a semiconductor layer is deposited.

The rear electrode layer 210, the light absorbing layer 220, the buffer layer 230, the high resistance buffer layer 240, and the transparent electrode layer 250 are formed to have stepped edges, but are not limited thereto. This is, each layer may be formed with a slope.

The bus lines 300 are formed on the top side of the semiconductor layer 200. In more detail, the bus lines 300 may be formed at the both edges of the top side of the semi-conductor layer 200. For example, the bus line 300 may be formed to directly contact the transparent electrode layer 250.

Additionally, the bus lines 300 may be formed to face each other. The bus lines 300 may be formed at one side and the other side of the substrate 100 to be parallel to the through lines 120 on the semiconductor layer 200.

The bus lines 300 may be formed of a metal material having excellent conductivity and low melting point. For example, the bus line 300 may be formed of at least one selected from the group consisting of Ag, Al, Mg, Mn, Sb, Mo, and combinations thereof. Additionally, the surface of the bus line 300 may be coated with a coating material to prevent oxidization.

The bus lines 300 are formed to be electrically connected to the bus bars 400. The bus bar 400 may be electrically connected to the bus line 300 in contact with a predetermined area of the bus line 300. Additionally, the bus bar 400 connected to the bus line 300 extends to the rear of the substrate 100 through the through line 120 in the substrate 100. Accordingly, the bus bar 400 may provide power to the outside through a junction box (not shown) at the rear of the substrate 100. Herein, the bus bar 400 may be formed of the same material as the bus line 300.

While the bus bar 400 passes through the through line 120 in the substrate 100, it may not contact the side of the semiconductor layer 200. For this, an insulation member may be provided between the bus bar 400 and the side of the semiconductor layer 200. As shown in FIG. 2, the bus bar 400 is formed perpendicular to the bus line 300 to be electrically connected to the bus line 300, but is not limited thereto. That is, the bus bar 400 may be formed extending along the bus line 300 to pass through the through line 120 in the substrate 100 from an upper or lower portion of the bus line 300.

In a solar cell according to an embodiment, since the through line 120 in the substrate 100 is formed adjacent to the semiconductor layer 200, the bus bar 400 may be formed with a very short length. This may reduce an internal resistance in the bus bar 400 to increase power efficiency. Additionally, in a solar cell according to an embodiment, since the through line 120 is formed with a bar shape extending in one direction, the degree of freedom in positioning a junction box (not shown) at the rear of the substrate 100 may be increased according to the position of the bus bar 400.

Moreover, the through line 120 in the substrate 100 is formed with a bar shape in FIGS. 2 and 3, but is not limited thereto.

As shown in FIG. 3, the through line 120 has a middle part extending in one direction of the substrate 100 and both ends 120a bent toward the outer side of the substrate 100. Here, only one of the both ends 120a of the through line 120 may be bent.

Additionally, referring to FIG. 4, the both ends 120b of the through line 120 may be bent toward the inner side of the substrate 100. Additionally, the both ends 120b may be formed not to interfere with the semiconductor layer 200 between the through lines 120. As shown in FIGS. 3 and 4, when the through line 120 includes the bending portion, the bus bar 400 is disposed at the rear of the substrate 100 through the both bending ends 120 of the through line 120 to make the length of the bus bar 400 shorter.

Moreover, referring to FIG. 5, the through line 120 may be formed to have a curve. The angle of the curve is not limited to a specific value and may vary if necessary.

As shown in FIGS. 3 to 5, the through line 120 through which the bus bar 400 passes is formed with various shapes in the substrate 100, so that the degree of freedom in positioning a junction box (not shown) at the rear of the substrate and the degree of adjacency to the bus bar 400 may be improved.

Hereinafter, a method of manufacturing a solar cell according to an embodiment will now be described with reference to FIGS. 6 to 10. A description of the method refers to the above description of the solar cell. The above description of the solar cell may be substantially combined with the description of the method.

Figure 6:
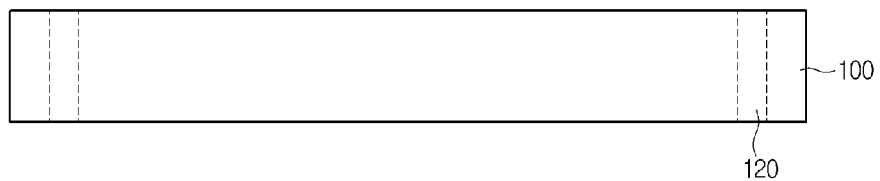
FIGS. 6 to 10 are sectional views illustrating a method of manufacturing a solar cell according to an embodiment.

Referring to FIG. 6, the through line 120 is formed on the substrate 100. In more detail, the through line 120 may extend in one direction and may be formed through laser or additional glass cutting equipment. In the following processes, the substrate 100 may be supported by a substrate fixing device 500 combined with the through line 120. The substrate fixing device 500 facilitates the fixation and adhesion of the substrate 100 during manufacturing processes.

Figure 7:
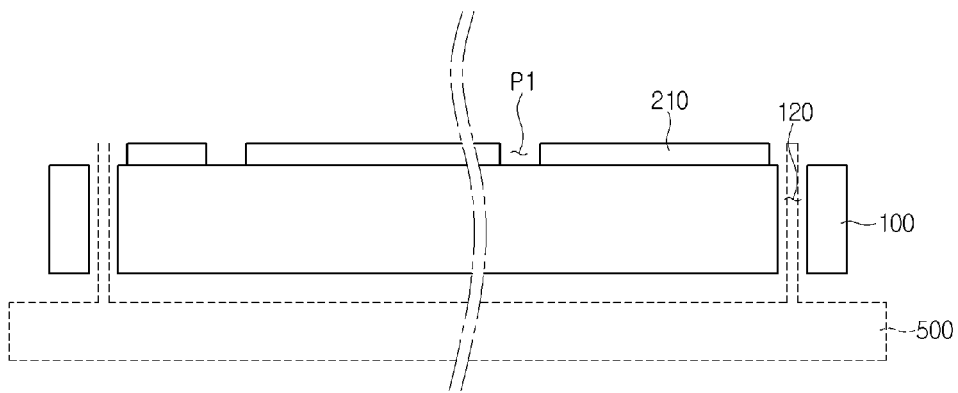
Figure 8:
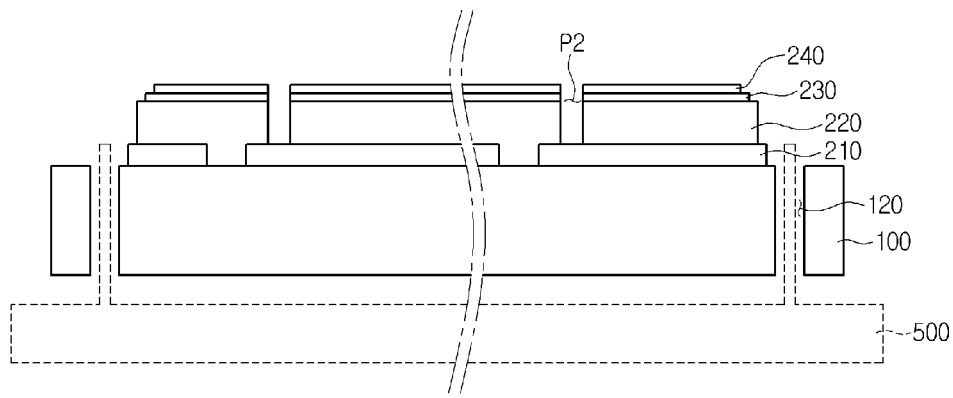
Figure 9:
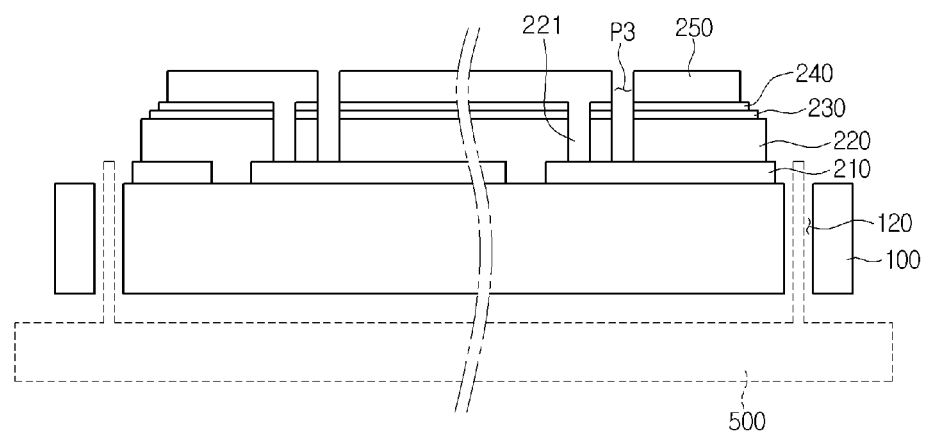

Then, referring to FIGS. 7 to 9, the semiconductor layer 200 is formed on the substrate 100. Referring to FIG. 7, the rear electrode layer 200 may be formed on the substrate 100 through methods such as physical vapor deposition (PVD) or plating. For example, sputtering is performed using Mo between the through lines 120 in the substrate 100 to form the rear electrode layer 210. Then, a first patterning process is performed to allow a part of the substrate 100 to be exposed through the first through groove P1. The rear electrode layer 210 is divided into a plurality of partitions by the first through groove P1. The first patterning process P1 may be performed through a scribing process using laser.

Referring to FIG. 8, a light absorbing layer 220, a buffer layer 230, and a high resistance buffer layer 240 are sequentially formed on the rear electrode layer 210. The forming of the light absorbing layer 220 includes forming a CIG based precursor layer on the rear electrode layer 210 by using a Cu target, an In target, and a Ga target and providing a result prepared by a reaction of the metal precursor layer and Se through a selenization process. Alternatively, the light absorbing layer 220 may be formed using Cu, In, Ga, and Se through co-evaporation.

Additionally, CdS and ZnO may be deposited to form the buffer layer 230 and the high resistance buffer layer 240 through a Chemical Bath Deposition (CBD) method and a sputtering method.

Then, a second patterning process is performed to form a second through groove P2 in the light absorbing layer 220, the buffer layer 230, and the high resistance buffer layer 240. Each of the layers 220, 230, and 240 is separately formed and the rear electrode layer 210 is partially exposed through the second patterning process P2. Here, the second patterning process may be performed through a silver laser scribing method or a member such as an additional knife.

While the light absorbing layer 210 to the high resistance buffer layer 230 are deposited, the substrate 100 may be supported by the substrate fixing device 500. Additionally, the substrate fixing device 500 may provide a gap to the substrate 100 to allow each of the layers 220, 230, and 240 on the substrate 100 to have stepped portions when the light absorbing layer 220, the buffer layer 230, and the high resistance buffer layer 240 are deposited. Thus, in order to form the semiconductor layer 200 having a stepped portion, each of the layers 220, 230, and 240 is sequentially stacked, so that an additional edge removing process after other processes may be omitted.

Referring to FIG. 9, a transparent electrode layer 250 is formed on the high resistance buffer layer 240. The transparent electrode layer 250 may be formed by stacking a transparent conductive material on the high resistance buffer layer 240. At this point, the transparent conductive material is inserted into the inside of the second through groove P2 to form connecting lines 221. The connecting lines 221 may electrically connect the transparent electrode layer 250 and the rear electrode layer 210. Then, once the transparent electrode layer 250 is deposited, a third patterning process is performed to form a third through groove P3. Through the third patterning process, the rear electrode layer 210 is partially exposed and the semiconductor layer 220 is divided into a plurality of unit cells. The third through groove P3 may be formed through a mechanical method or a laser irradiation method.

Additionally, while the transparent electrode layer 250 is deposited, the substrate 100 may be spaced from the substrate fixing device 500, and by using that, the transparent electrode layer 250 may be formed to have a stepped portion with the high resistance buffer layer 240.

Through the above-mentioned process, the semiconductor layer 200 may be formed with a stepped multi-layered structure. In more detail, each of the rear electrode layer 210, the light absorbing layer 220, and the transparent electrode layer 230 is formed toward the inner side of the substrate 100, being spaced a predetermined interval from the both sides of the substrate 100.

Figure 10:
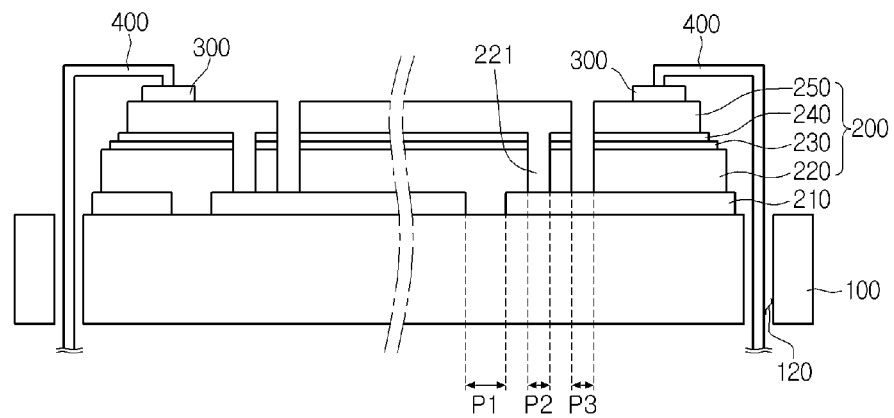

Then, as shown in FIG. 10, a bus line 300 is formed on the transparent electrode layer 250.

The bus line 300 may be formed of one selected from the group consisting of Ag, Al, Mg, Mn, Sb, Mo, and combinations thereof, and may be formed parallel to the through line 120 in the substrate 100.

Then, a process is performed to adhere one end of the bus bar 400 to a predetermined area of the bus line 300. The one end of the bus bar 400 may be electrically connected to the bus line 300 through a laser process. Next, the other end of the bus bar 400 is disposed at the rear of the substrate 100 through the through line 120 in the substrate 100 and is connected to a junction box (not shown) at the rear of the substrate 100. As a result, a high efficient solar cell is completed.

Features, structures, and effects described in the above embodiments are incorporated into at least one embodiment of the present disclosure, but are not limited to only one embodiment. Moreover, features, structures, and effects exemplified in one embodiment can easily be combined and modified for another embodiment by those skilled in the art. Therefore, these combinations and modifications should be construed as falling within the scope of the present disclosure. Although embodiments have been described with reference to a number of illustrative embodiments thereof, it should be understood that numerous other modifications and embodiments can be devised by those skilled in the art that will fall within the spirit and scope of the principles of this disclosure.

More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
    a substrate including through lines opposing to each other;
    a semiconductor layer having a stepped structure on a top side of the substrate;
    bus lines at both edges of a top side of the semiconductor layer; and
    bus bars connected electrically to the bus lines, respectively, and extending to a rear side of the substrate through the through lines;
    wherein the through lines are formed in areas not interfering with the semiconductor layer and each bus bar passes through a through line in the substrate without contacting the semiconductor layer; and
    wherein at least one end of each through line includes a bending portion.

2. The solar cell according to claim 1, wherein the semiconductor layer is disposed between the through lines.

3. The solar cell according to claim 1, wherein the through lines have a straight line or curved shape.

4. The solar cell according to claim 1, wherein ends of the through lines are bent toward the inside or outside of the substrate.

5. The solar cell according to claim 1, wherein the semiconductor layer has a stepped multi-layered structure.

6. The solar cell according to claim 1, wherein the semiconductor layer comprises:
    a rear electrode layer on the substrate;
    a light absorbing layer on the rear electrode layer; and
    a transparent electrode layer on the light absorbing layer.

7. The solar cell according to claim 6, wherein each width of the substrate, the rear electrode layer, and the transparent electrode layer is sequentially narrower.

8. A method of manufacturing a solar cell, the method comprising:
    forming through lines to face each other on a substrate;
    forming a semiconductor layer on a top side of the substrate;
    forming bus lines at both edges of a top side of the semiconductor layer;
    adhering one end of a bus bar to the bus line; and
    positioning the other end of the bus bar at a rear side of the substrate through the through line;
    wherein the semiconductor layer is formed as a stepped structure;
    wherein the through lines are formed in areas not interfering with the semiconductor layer and each bus bar passes through a through line in the substrate without contacting the semiconductor layer; and
    wherein at least one end of each through line includes a bending portion.

9. The method according to claim 8, wherein the forming of the semiconductor layer comprises:
    forming a rear electrode layer on the substrate;
    forming a light absorbing layer on the rear electrode layer; and
    forming a transparent electrode layer on the light absorbing layer.

10. The method according to claim 9, wherein the forming of the semiconductor layer comprises forming the substrate, the rear electrode layer, the light absorbing layer, and the transparent electrode layer with a stepped multi-layered structure.

11. The method according to claim 10, wherein each of the rear electrode layer, the light absorbing layer, and the transparent electrode layer is formed being spaced by a predetermined distance from both sides of the substrate to the inside of the substrate.

12. The method according to claim 8, wherein the forming of the semiconductor layer comprises fixing the substrate to a substrate fixing device combined with the through line.

13. The method according to claim 8, wherein the through lines have a straight line or curved shape.

* * * * *